US007514752B2

(12) United States Patent
Kohyama

(10) Patent No.: US 7,514,752 B2
(45) Date of Patent: Apr. 7, 2009

(54) REDUCTION OF SHORT-CIRCUITING BETWEEN CONTACTS AT OR NEAR A TENSILE-COMPRESSIVE BOUNDARY

(75) Inventor: Yusuke Kohyama, Poughkeepsie, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 644 days.

(21) Appl. No.: 11/211,604

(22) Filed: Aug. 26, 2005

(65) Prior Publication Data

US 2007/0045747 A1 Mar. 1, 2007

(51) Int. Cl.
*H01L 29/76* (2006.01)

(52) U.S. Cl. ............... 257/365; 257/351; 257/E27.046; 257/369

(58) Field of Classification Search .................. 257/351, 257/365, E27.046, 369
See application file for complete search history.

(56) References Cited

U.S. PATENT DOCUMENTS

2004/0075148 A1* 4/2004 Kumagai et al. ............. 257/369

OTHER PUBLICATIONS

H.S. Yang, et al., "Dual Stress Liner for High Performance sub-45nm Gate Length SOI CMOS Manufacturing", IEEE, 2004, 3 pp.

* cited by examiner

*Primary Examiner*—Evan Pert
*Assistant Examiner*—Tan N Tran
(74) *Attorney, Agent, or Firm*—Banner & Witcoff, Ltd.

(57) ABSTRACT

Methods and apparatus are described that reduce the possibility that unintended subway short-circuits will occur between contacts of different potentials along the boundary between tensile and compressive liners (the T-C boundary). This may be done without unduly increasing the size of the semiconductor device, or even increasing the size at all over previous designs. For example, simply by adjusting the layout of the device, the contacts of two different common gates may be offset in opposing directions relative to the T-C boundary. Or, by forming a T-C boundary having a zigzag or other similar pattern, the contacts may be arranged even closer together while still reducing the likelihood of short-circuiting subways forming. Such layout adjustments do not otherwise require any additional steps or cost.

20 Claims, 5 Drawing Sheets

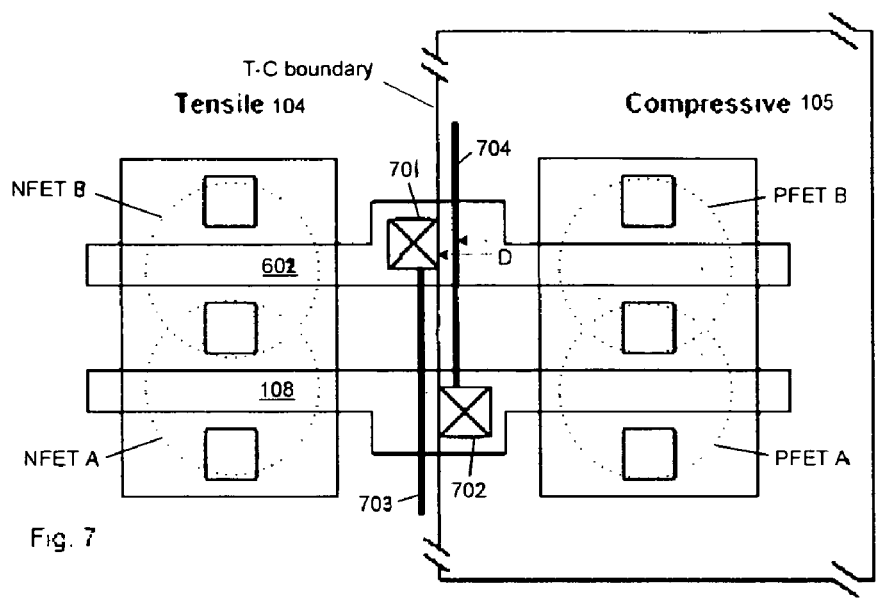
Fig. 7
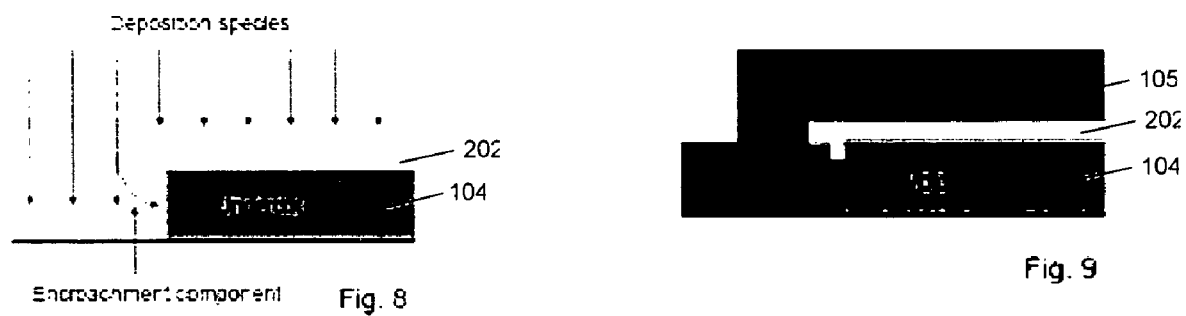
Fig. 8
Fig. 9
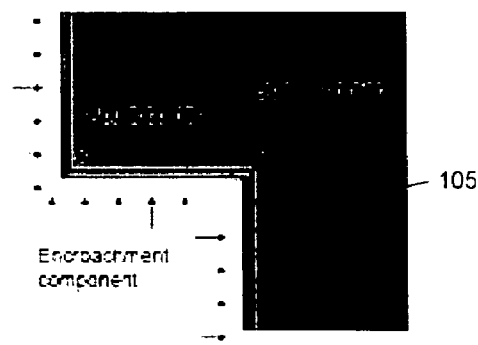
Fig. 10

REDUCTION OF SHORT-CIRCUITING BETWEEN CONTACTS AT OR NEAR A TENSILE-COMPRESSIVE BOUNDARY

BACKGROUND

It is well-known that applying appropriate compressive stress to the channel of a P-type field-effect transistor (PFET) and appropriate tensile stress to the channel of an N-type field-effect transistor (NFET) drastically improves channel performance. This is usually accomplished by disposing a compressive silicon nitride (SiN) layer over a PFET and a tensile SiN layer over an NFET.

For example, referring to FIG. 1, an NFET and a PFET (also referred to herein as NFET A and PFET A) are disposed on a silicon layer 100. The portion of silicon layer 100 shown is divided into a P-well 101 and an N-well 102. In addition, the NFET and PFET are isolated from neighboring components with a shallow-trench isolation layer 106, and are also covered with a dielectric material 103. A tensile SiN layer 104 covers the NFET, and a compressive SiN layer 105 covers the PFET. Tensile and compressive layers 104, 105 contact each other at a tensile-compressive (T-C) boundary. The NFET and PFET share a common polysilicon gate 108, which extends across the T-C boundary, which is electrically connected to a conductive plug 107 that allows electrical connection of common gate 108 to other portions of the circuitry.

As can be seen in FIG. 1, tensile and compressive layers 104, 105 slightly overlap each other at the T-C boundary. This is a result of the manufacturing process typically used to form tensile and compressive layers 104, 105. The overlap is considered desirable as it prevents unintentional etching of structures disposed below layers 104, 105. However, where conductive plug 107 is co-located with the T-C boundary as shown in FIG. 1, the overlap can cause problems. In particular, referring to FIGS. 5 and 6, when forming conductive plug 107 (which may be formed of, for example, tungsten (W)) using traditional manufacturing processes, one or more conductive "subways" 501, 502 may be formed that extend parallel to and on opposing sides of the T-C boundary. These subways 501, 502 are essentially conductive material that leaks through tunnels created between compressive and tensile layers 104, 105.

Techniques for reducing the size of semiconductor devices include placing plug 107 and other similar plugs on the T-C boundary and configuring NFET/PFET pairs to share common gates. However, this can cause problems. For instance, where another plug 601 for another gate 602 common to a second NFET/PFET pair (NFET B and PFET B, the positions of which are roughly indicated with broken circles) is also co-located with the T-C boundary, there is a significant likelihood that subway 501 and/or subway 502 will electrically connect plug 107 with plug 601. This is extremely undesirable as plug 107 and plug 601 should be able to be at different voltages from each other as desired. Thus, subways 501 and/or 502 may act as unintended short-circuits in a significant percentage of manufactures devices having the shown configuration.

One possibility would be to prohibit locating contacts near the T-C boundary. However, this rule would drastically increase chip size. This is not a practical option.

SUMMARY

There is therefore a need to reduce the possibilities that such unintended subway short-circuits will occur. This should preferably be done without unduly increasing the size of the semiconductor device. For example, simply by adjusting the layout of the device, the contacts of two different common gates may be offset in opposing directions relative to the T-C boundary. Or, by forming a T-C boundary having a zigzag or other similar pattern, the contacts may be arranged even closer together while still reducing the likelihood of short-circuiting subways forming. Such layout adjustments do not otherwise require any additional steps or cost.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIG. 7 is a plan view of an illustrative alternative device configuration.

FIGS. 8-10 are cross-sectional views illustrating an undercut fill mechanism.

DETAILED DESCRIPTION OF ILLUSTRATIVE EMBODIMENTS

Figure 2:
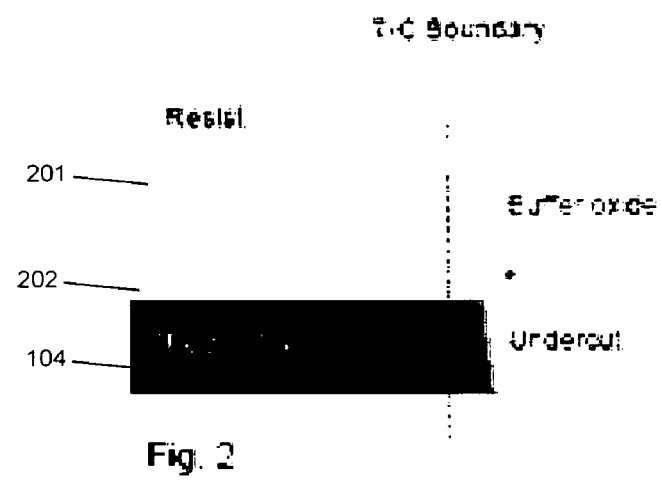
FIGS. 2-4 are cross-sectional views showing illustrative steps that may be taken to generate a dual-stress liner structure.
Figure 3:
Figure 4:
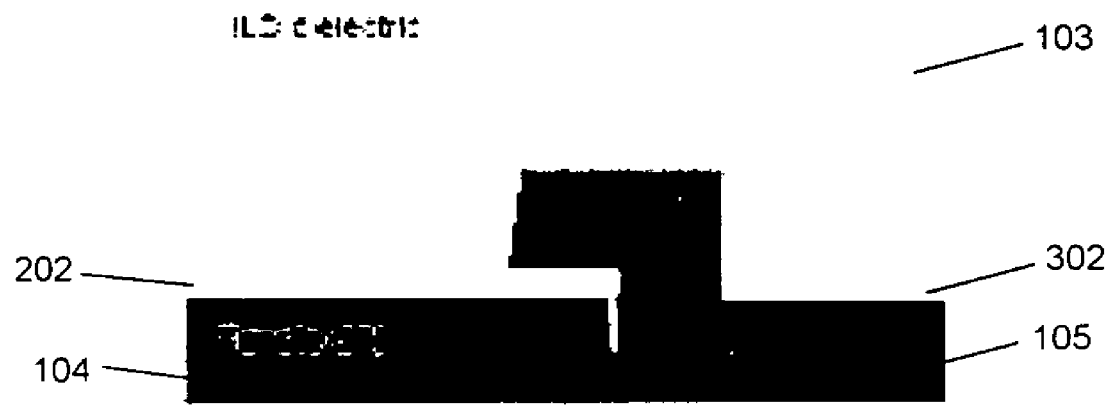

FIGS. 2-4 show illustrative steps that may be taken to create a dual-stress liner. A dual-stress liner is the combination of a tensile layer and a compressive layer side-by-side, such as tensile and compressive layer 104, 105. Referring first to FIG. 2, a first buffer oxide layer 202 is disposed onto tensile SiN layer 104, and a first resist layer 201 is disposed over a portion of tensile layer 104. Using first resist layer 201 as a mask, first buffer oxide layer 202 and tensile layer 104 are patterned by conventional lithography and reactive ion etching (RIE) techniques. First buffer oxide layer 202 is used as an etching stop for upper-layer RIE and as an adhesion layer for adhering resist layer 201 to tensile layer 104. As can be seen in FIG. 2, an undesirable undercut is normally created as a result of conventional RIE. In other words, the right-hand etched edge of tensile layer 104 as seen in FIG. 2 extends at an inward slant toward buffer oxide layer 202. This means that there is an overhang of first buffer oxide layer 202.

Next, referring to FIG. 3, the creation of compressive SiN layer 105 is performed in a similar manner. A second buffer oxide layer 302 is disposed onto compressive layer 105, and first resist layer 201 is removed. Then, a second resist layer 301 is disposed over a portion of compressive layer 105. Using second resist layer 301 as a mask, second buffer oxide layer 302 and compressive layer 105 are patterned by conventional lithography and RIE techniques. Second buffer oxide layer 302 is used as an etching stop for upper-layer RIE and as an adhesion layer for adhering resist layer 301 to compressive layer 105. As can be seen in FIG. 3, an undesirable undercut is again normally created as a result of conventional RIE. In other words, the left-hand etched edge of compressive layer 105 as seen in FIG. 3 extends at an inward slant toward second buffer oxide layer 302. This means that there is an overhang of second buffer oxide layer 302.

Figure 5:
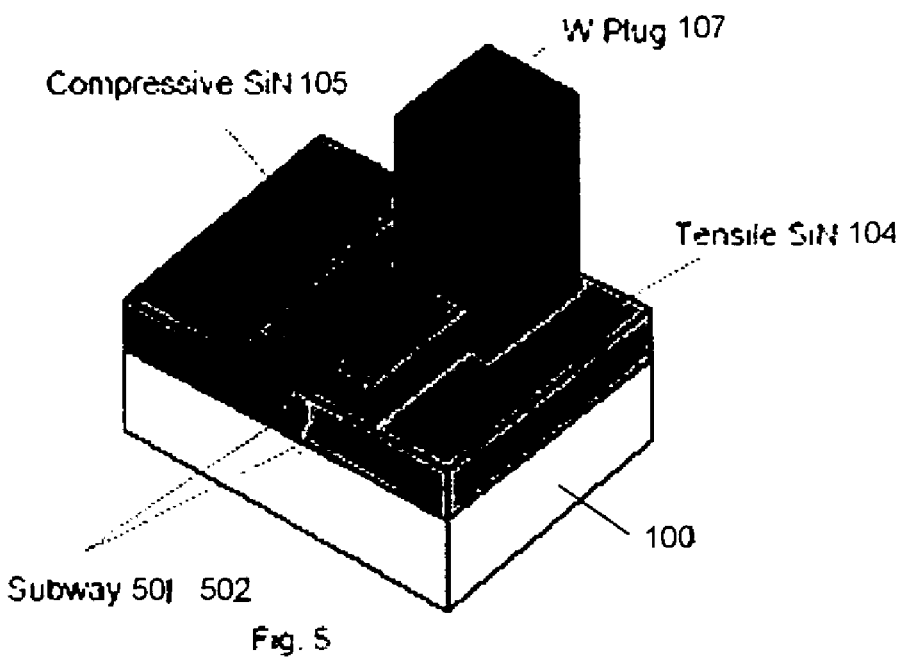
FIG. 5 is a perspective cut-away view of a portion of the device of FIG. 1.
Figure 6:
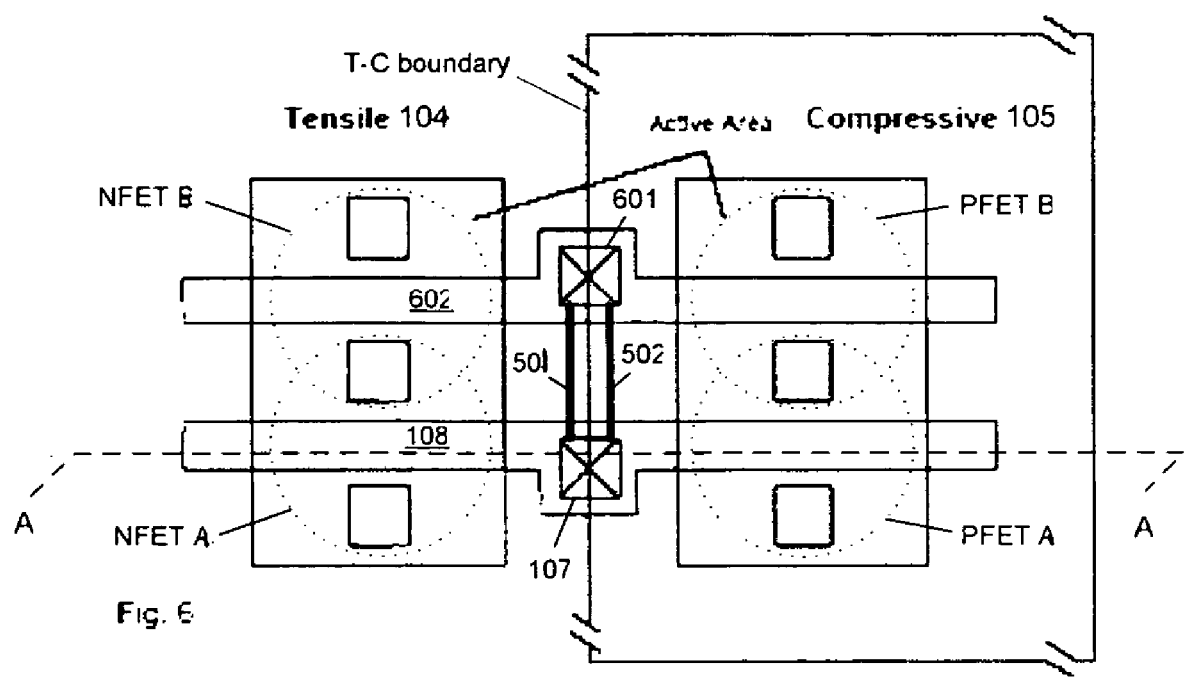
FIG. 6 is a plan view of the device of FIG. 1.

Next, referring to FIG. 4, resist layer 301 is removed and dielectric layer 103 is disposed over the entire structure. As can be clearly seen in FIG. 5, two voids have been created as a result of the undercuts. These voids can often be unintentionally filled with contact metal, such as tungsten, or other conductive material when creating plugs 107 and 601, as previously discussed with regard to FIG. 5. This can result in undesirable short-circuiting subways 501 and 502. Of course, the order of laying down tensile layer 104 and compressive layer 105 may be reversed.

Accordingly, several illustrative alternatives are now described that may reduce the likelihood that short-circuiting subways will be developed. For example, referring to FIG. 7, two contacts 701 and 702 are offset in opposing directions relative to the T-C boundary. In this example, contact 701 is shown to be offset toward the left of the T-C boundary, and contact 702 is shown to be offset toward the right of the T-C boundary. The minimum particular offset used depends upon the particular design of the semiconductor device being manufacture. However, as an example, it may be desirable to offset contacts 701 and 702 sufficiently such that a distance D between subway 704 and contact 701 (and also between subway 703 and contact 702) is at least ten nanometers.

Figure 1:
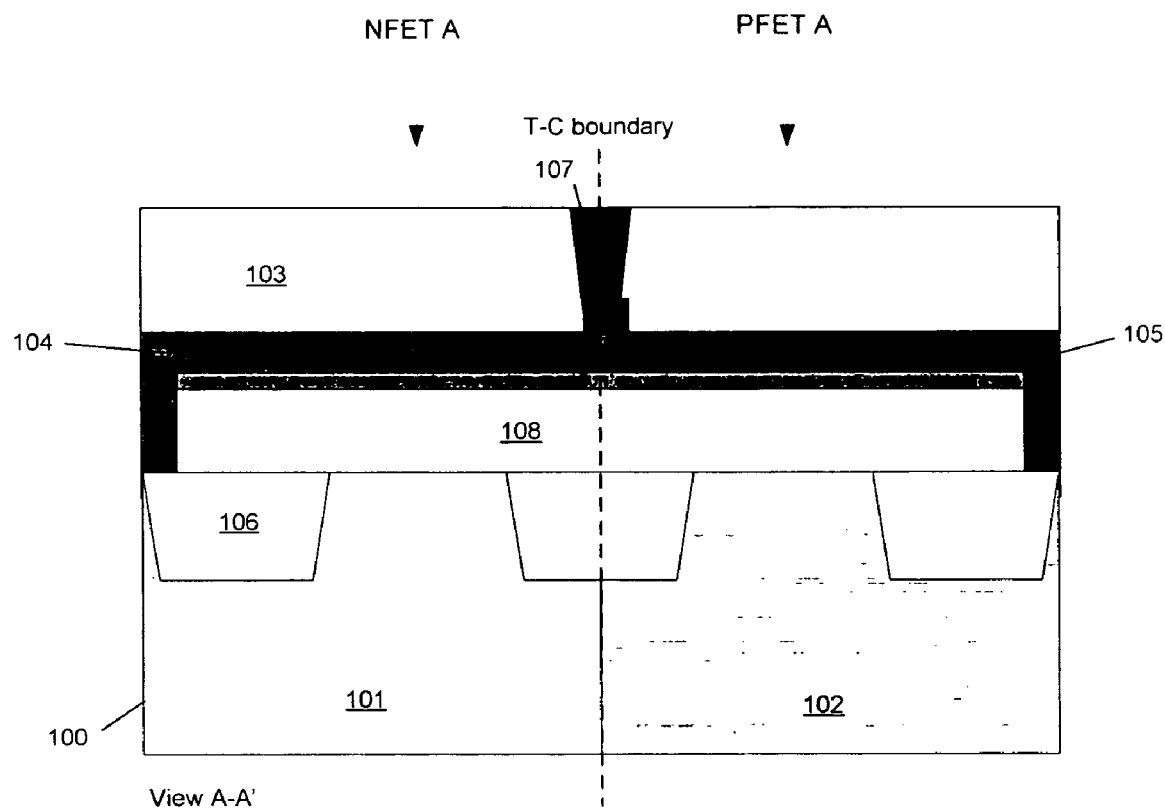
FIG. 1 is a cross-sectional view of an illustrative semiconductor device.

It should be noted that, all other factors being equal, the device shown in FIG. 7 may be slightly larger than the device shown in FIG. 1, by approximately one contact width (e.g., about ninety nanometers). This size difference is due to the offset of contacts 701 and 702. In this particular example, one side of each contact 701, 702 is also located at the T-C boundary and extends along the T-C boundary. This maintains any impact on device size at a reasonable level. However, contacts 701, 702 may be offset away from each other even further such that they each are close to, but do not touch, the T-C boundary.

The next two examples of contact configuration take advantage of well-known properties of undercut formation during manufacture of a dual-stress liner. These properties are explained with regard to FIGS. 8-10. After undercut formation in tensile layer 104, as described previously, compressive layer 105 is deposited. In general, the deposition species has an encroachment component that allows it to at least partially fill the undercut. However, the completeness of filling the undercut depends on the deposition technology. For example, low-pressure chemical vapor deposition (LP-CVD) provides good undercut filling properties, while plasma-enhanced chemical vapor deposition (PE-CVD) provides poor undercut filling properties. Which technology is used in a given situation is selected based on other restrictions such as process temperature, tool throughput, process cost, and device layout. Recently, low temperature processes such as PE-CVD have been widely used for high performance devices, however as previously mentioned this process provides poor filling properties.

Moreover, with reference to FIG. 10, it is much easier to fill an acute (convex) corner than an obtuse (concave) corner. How easily acute and obtuse corners are filled is due at least in part to the encroachment component density of the particular deposition species used. In any event, while obtuse corners are not necessarily completely filled, acute corners are much more likely to be completely filled. This means that, if the T-C boundary has an acute corner, then any void that forms at that boundary is likely to be interrupted at the acute corner due to complete filling of the undercut at the acute corner by the deposition species (in this example, completely filled by compressive layer 105). Again, the deposition order of tensile layer 104 and compressive layer 105 may be reversed.

Figure 11:
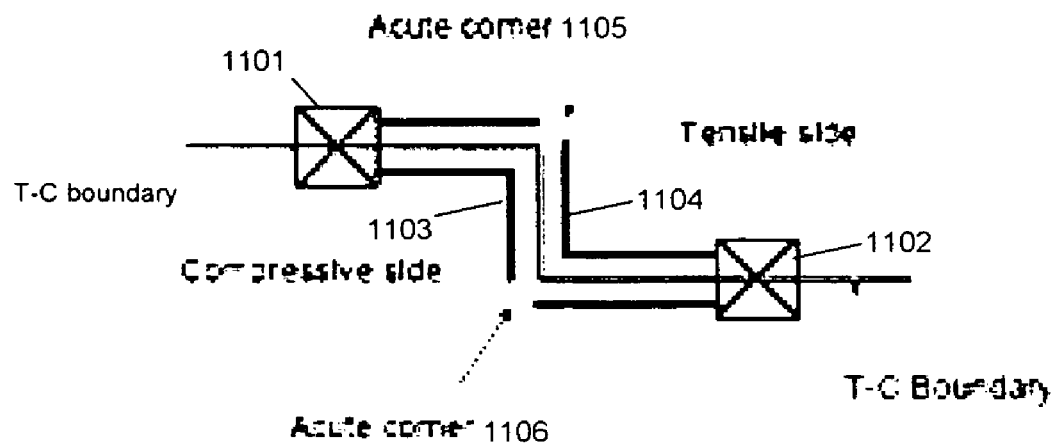
FIGS. 11 and 12 are plan view of two additional illustrative alternative device configurations.

FIG. 11 takes advantage of the acute corner fill property by including at least one acute corner along the T-C boundary between the two contacts in question. For example, contacts 1101 and 1102 (which may be at different potentials) may be located, even centered, on the T-C boundary as has been previously done. However, in this case, the T-C boundary is zigzagged such that it has two acute corners. In particular, in a region between contacts 1101 and 1102, the T-C boundary has first and second portions offset from each other and a third portion connecting the first and second portions.

Acute corner 1105 is an acute corner of compressive layer 105, and acute corner 1106 is an acute corner of tensile layer 104. This means that the undercut of compressive layer 105 at acute corner 1106 is likely to be completely filled, and also that the undercut of tensile layer 104 at acute corner 1105 is likely to be completely filled. Such complete fillings mean that subways 1103 and 1104 would be interrupted at these two complete fillings, as indicated in FIG. 11 by the breaks in subways 1103 and 1104. This further means that any electrically conductivity of subways 1103 and 1104 would also be interrupted, thus reducing the likelihood that subways 1103 and 1104 would create a short circuit between contacts 1101 and 1102.

Figure 12:
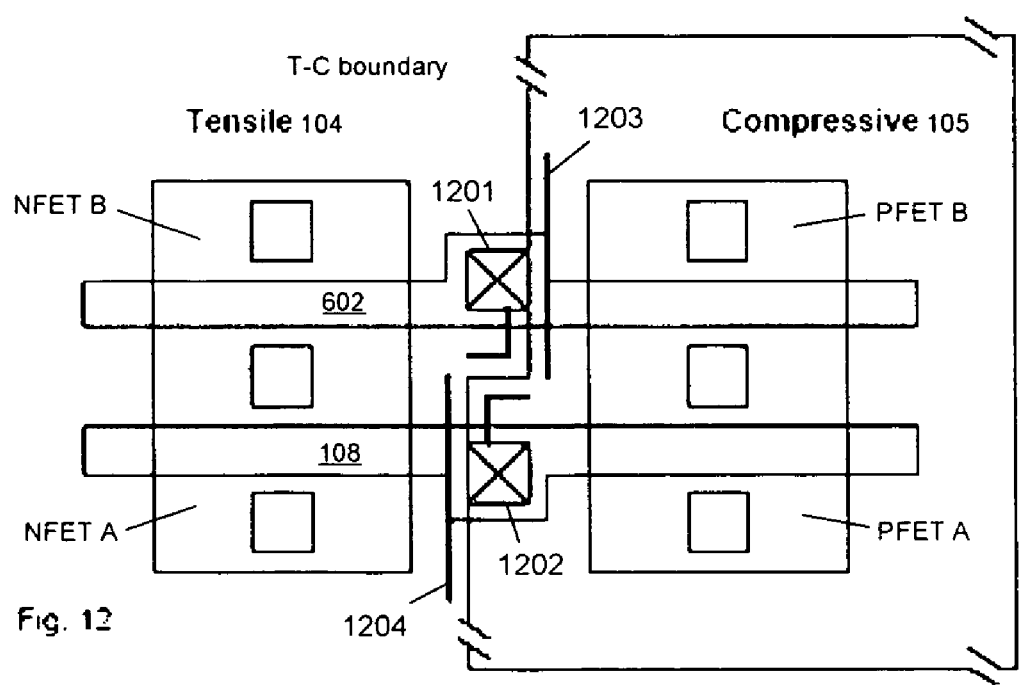

In another example, referring to FIG. 12, the T-C boundary may again have a zigzagged arrangement, but in this case contacts 1201 and 1202 (which may be at different potentials) are offset from the T-C boundary in opposing directions, instead of being centered on the T-C boundary. In doing so, it may be arranged such that contacts 1201 and 1202 are aligned (i.e., not offset) relative to each other even though they are each offset on opposing sides of the T-C boundary. Such an arrangement is shown in FIG. 12. This arrangement retains the advantage of providing acute corners while providing little or no area penalty. In other words, the arrangement of FIG. 12 may utilize the same amount of area as the arrangement of FIG. 1.

Thus, semiconductor devices having contacts near or on the T-C boundary may be made much more reliable simply by adjusting the layout of the contacts and/or the T-C boundary. This may be done without any other change in the manufacturing process—it is merely a layout modification. Accordingly, various aspects as disclosed herein may be performed without any increase in cost over prior art methods.

What is claimed is:

1. A semiconductor device, comprising:
a first PFET and a first NFET sharing a common first gate;
a second PFET and a second NFET sharing a common second gate;
a compressive stress layer disposed on the first and second PFETs;
a tensile stress layer disposed on the first and second NFETs and contacting the compressive stress layer at a boundary;
a first conductive plug electrically connected to the first gate and extending through the compressive stress layer; and
a second conductive plug electrically connected to the second gate and extending through the tensile stress layer, wherein the first and second conductive plugs are offset in opposing directions relative to the boundary.

2. The semiconductor device of claim 1, wherein the first conductive plug does not contact the tensile stress layer and the second conductive plug does not contact the compressive stress layer.

3. The semiconductor device of claim 1, wherein an edge of each of the first and second conductive plugs is at the boundary and extends along the boundary.

4. The semiconductor device of claim 1, wherein the first and second conductive plugs are at different voltages from each other.

5. The semiconductor device of claim 1, wherein the compressive stress layer and the tensile stress layer overlap each other at the boundary.

6. The semiconductor device of claim 1, wherein the first conductive plug extends fully through the compressive stress layer and the second conductive plug extends fully through the tensile stress layer.

7. A semiconductor device, comprising:
a silicon layer;
a compressive stress layer disposed on a first portion of the silicon layer;
a tensile stress layer disposed on a second different portion of the silicon layer and contacting the compressive stress layer at a boundary, wherein the boundary has first and second portions offset from each other and a third portion connecting the first and second portions;
a first conductive plug extending through the compressive stress layer and disposed on a first side of the third portion of the boundary; and
a second conductive plug extending through the tensile stress layer and disposed on a second opposing side of the third portion of the boundary.

8. The semiconductor device of claim 7, wherein the first conductive plug also extends through the tensile stress layer and the second conductive plug also extends through the compressive stress layer.

9. The semiconductor device of claim 7, wherein the first and second portions of the boundary are parallel with each other and the third portion of the boundary is orthogonal to the first and second portions of the boundary.

10. The semiconductor device of claim 7, wherein an edge of the first conductive plug is at the first portion of the boundary and extends along the first portion of the boundary, and wherein an edge of the second conductive plug is at the second portion of the boundary and extends along the second portion of the boundary.

11. The semiconductor device of claim 7, further including:
a first PFET and a first NFET sharing a common first gate that is electrically connected to the first conductive plug; and
a second PFET and a second NFET sharing a common second gate that is electrically connected to the second conductive plug,
wherein the compressive stress layer is disposed on the first and second PFETs and the tensile stress layer is disposed on the first and second NFETs.

12. The semiconductor device of claim 7, wherein the first and second conductive plugs are at different voltages from each other.

13. The semiconductor device of claim 7, wherein the compressive stress layer and the tensile stress layer overlap each other at the boundary.

14. The semiconductor device of claim 7, further including:
a first polysilicon layer disposed between the compressive layer and the silicon layer and also between the tensile stress layer and the silicon layer and extending across the boundary, wherein the first polysilicon layer is electrically connected to the first conductive plug; and
a second polysilicon layer physically separate from the first polysilicon layer, disposed between the compressive layer and the silicon layer and also between the tensile stress layer and the silicon layer, and extending across the boundary, wherein the second polysilicon layer is electrically connected to the second conductive plug.

15. A semiconductor device, comprising:
a silicon layer;
a compressive stress layer disposed on a first portion of the silicon layer;
a tensile stress layer disposed on a second portion of the silicon layer and contacting the compressive stress layer at a boundary;
a first polysilicon layer disposed between the compressive layer and the silicon layer and also between the tensile stress layer and the silicon layer and extending across the boundary;
a second polysilicon layer physically separate from the first polysilicon layer, disposed between the compressive layer and the silicon layer and also between the tensile stress layer and the silicon layer, and extending across the boundary;
a first conductive plug electrically connected to the first polysilicon layer and extending through the compressive stress layer; and
a second conductive plug electrically connected to the second polysilicon layer and extending through the tensile stress layer,
wherein the first and second conductive plugs are offset in opposing directions relative to the boundary.

16. The semiconductor device of claim 15, wherein the first conductive plug does not contact the tensile stress layer and the second conductive plug does not contact the compressive stress layer.

17. The semiconductor device of claim 15, wherein an edge of each of the first and second conductive plugs is at the boundary and extends along the boundary.

18. The semiconductor device of claim 15, wherein the first and second conductive plugs are at different voltages from each other.

19. The semiconductor device of claim 15, wherein the compressive stress layer and the tensile stress layer overlap each other at the boundary.

20. The semiconductor device of claim 15, wherein the first conductive plug extends fully through the compressive stress layer and the second conductive plug extends fully through the tensile stress layer.

* * * * *